United States Patent
Farooq et al.

(10) Patent No.: US 8,120,175 B2
(45) Date of Patent: Feb. 21, 2012

(54) SOFT ERROR RATE MITIGATION BY INTERCONNECT STRUCTURE

(75) Inventors: Mukta G. Farooq, Hopewell Junction, NY (US); Ian D. Melville, Highland, NY (US); Kevin S. Petrarca, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 563 days.

(21) Appl. No.: 11/947,832

(22) Filed: Nov. 30, 2007

(65) Prior Publication Data

US 2009/0140420 A1 Jun. 4, 2009

(51) Int. Cl.
*H01L 23/48* (2006.01)

(52) U.S. Cl. ............... 257/737; 257/703; 257/E23.115; 418/614

(58) Field of Classification Search .............. 438/614; 257/693, E23.115, 660, 684, 704, 707, 730, 257/E23.003, E23.004, E23.083, E23.181, 257/E23.193

See application file for complete search history.

(56) References Cited

U.S. PATENT DOCUMENTS

| 5,698,465 | A | 12/1997 | Lynch et al. |
| 6,555,296 | B2 | 4/2003 | Jao et al. |
| 6,929,974 | B2* | 8/2005 | Ding et al. ............... 438/106 |
| 7,271,483 | B2 | 9/2007 | Lin et al. |
| 2004/0173894 | A1* | 9/2004 | Glenn et al. ............ 257/693 |
| 2006/0051954 | A1* | 3/2006 | Lin et al. ................ 438/614 |

* cited by examiner

*Primary Examiner* — Matthew E Warren
*Assistant Examiner* — Fang-Xing Jiang
(74) *Attorney, Agent, or Firm* — Gibb I.P. Law Firm, LLC; Yuanmin Cai, Esq.

(57) ABSTRACT

A method creates a structure that comprises a carrier connected to an integrated circuit chip by pillars and openings. Thus, in this structure, at least one conductive pillar extends a distance or height from the surface of the integrated circuit chip and a barrier surrounds the lower portion of the conductive pillar such that the barrier covers at least some portion of the height of the pillar that is closest to the chip surface. There is at least one opening in the carrier that is large enough to accommodate the conductive pillar and the barrier, and the conductive pillar and the barrier are positioned in opening. A solder is used in the bottom of the opening to connect the conductive pillar to the bottom of the opening. The barrier prevents the solder from contacting the portion of the conductive pillar protected by the barrier.

8 Claims, 4 Drawing Sheets

SOFT ERROR RATE MITIGATION BY INTERCONNECT STRUCTURE

FIELD OF THE INVENTION

Embodiments herein generally relate to connections between chips and chip carriers, and more particularly to conductive pillar connections between chips and chip carriers.

BACKGROUND

In the field of semiconductor manufacturing, "soft" errors are caused when alpha particles impact devices within integrated circuit chips. A soft error rate (SER), which measures the number of soft errors, is generally used to gauge the significance of the problem. The soft error rate has become significant as the size of transistors and other devices within integrated circuit chips continues to be reduced. There are two primary sources of alpha particles which can eventually make their way into the device area of the chip, leading to SER problems. The first source is the packaging substrate itself, such as the ceramic substrate on which the chip is joined with copper connections. The second source is the solder such as Sn/Pb or Pb-free (Sn/Ag, Sn/Cu, Sn/Ag/Cu) solder that is used to join the chip to the package, which can also produce alpha particles.

SUMMARY

This disclosure provides solutions to the problem of above described soft errors. More specifically, embodiments herein provide a method that forms one or more conductive pillars (comprising, for example, copper) extending a certain distance from the surface of an integrated circuit chip. The method forms a barrier surrounding the lower portion of each conductive pillar. The portion of the pillar that is protected by the barrier comprises at least one-half of the total pillar height (distance) from the surface of the integrated circuit chip. The barrier covers the part (e.g., at least some portion) of the pillar that is closest to the chip surface. Further, the barrier comprises an alpha-particle transmission resistant material.

The method also forms one or more openings in a chip carrier. These openings are large enough to accommodate the conductive pillar and the barrier. Solder is deposited into the opening and rests at the bottom of the opening. The solder does not completely fill the opening, but only fills less than the bottom quarter or half of the depth of the opening. The conductive pillar (having the barrier) is inserted into the opening and the solder is reflowed (heated to a liquid state and then cooled back to a solid state) to connect the top of the conductive pillar to the bottom of the opening. The barrier prevents the solder from contacting the portion of the conductive pillar protected by the barrier.

Regarding the size of the opening, the process of forming the openings in the carrier can form such openings to a depth that is less than the distance the pillar extends from the surface of the substrate (less than the overall pillar height). This creates a gap between the chip and the carrier after the conductive pillar is inserted into the opening. An underfill can fill in this gap. Further, this process can form the openings such that the size and shape of the diameter of each opening matches the size and shape of the diameter of each barrier. In other words, the opening can be just slightly larger (e.g., 1%,-20%) than the barrier and can have the same general shape, which allows the barrier to seal (or partially seal) the opening. Thus, to a certain extent, the barrier can prevent the solder from exiting the opening during the reflowing of the solder.

This process creates a structure that comprises a carrier connected to an integrated circuit chip by the pillars and openings. Thus, in this structure, at least one conductive pillar extends a distance (or height) from the surface of the integrated circuit chip and the barrier surrounds the lower portion of the conductive pillar such that the barrier covers at least some height of the pillar, and can cover as much as the entire height of the pillar (e.g., the distance from the surface of the integrated circuit chip) that is closest to the chip surface. There is at least one opening in the carrier that is large enough to accommodate the conductive pillar and the barrier, and the conductive pillar and the barrier are positioned in opening. A solder is used in the bottom of the opening to connect the conductive pillar to the bottom of the opening. Again, the barrier prevents the solder from contacting the portion of the conductive pillar protected by the barrier.

Also, the solder can comprise a lead-based solder and/or a lead-free solder. The barrier can comprise an insulator. In addition, the carrier comprises corresponding conductors at the bottoms of the openings such that the process of inserting of the conductive pillars into the openings creates an electrical connection between the chip and the carrier.

By preventing the solder from contacting some of the pillar that is closest to the chip surface and by maintaining the solder within the openings, the embodiments herein substantially reduce the amount of alpha particles that will penetrate into the device regions of the chip, which in turn reduces the soft error rate.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF EMBODIMENTS OF THE INVENTION

Figure 1:
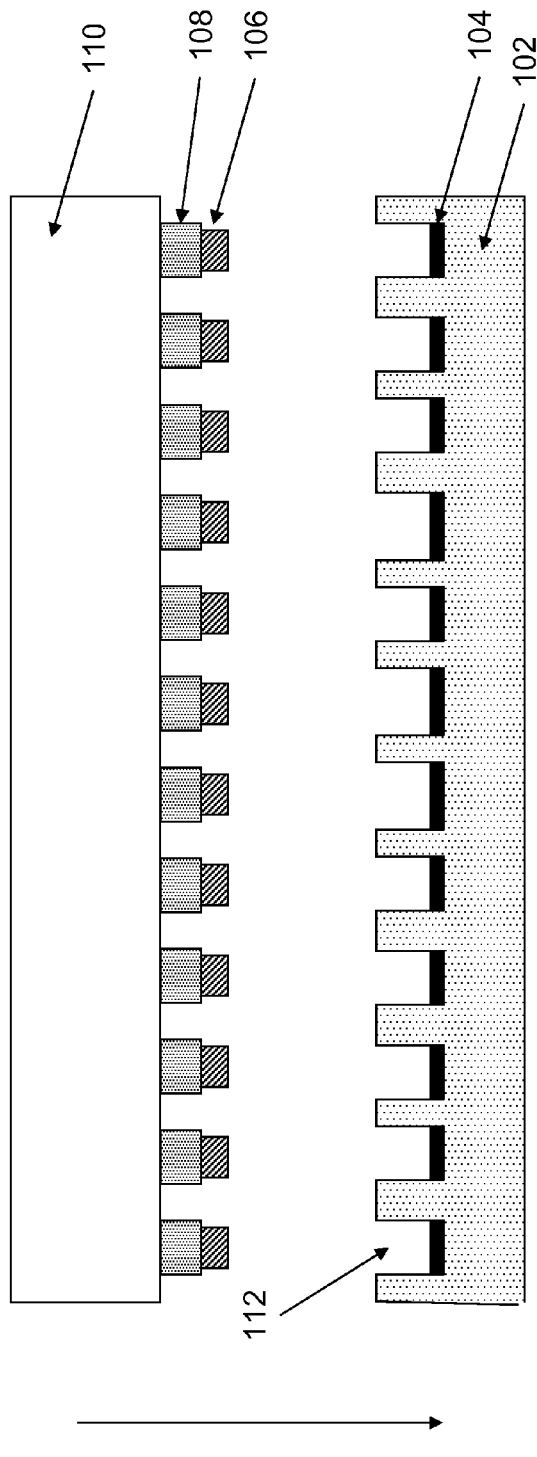
FIG. 1 is a schematic cross-sectional diagram of an integrated circuit structure according to embodiments herein.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As mentioned above, there are two primary sources of alpha particles which can eventually make their way into the device area of the chip, leading to SER problems. The first source is the packaging substrate itself, such as the ceramic substrate on which the chip is joined with copper connections. The second source is the solder such as Sn/Pb or Pb-free (Sn/Ag, Sn/Cu, Sn/Ag/Cu) solder that is used to join the chip to the package, which can produce alpha particles as well. Depending upon where the materials are mined and upon how they are processed, both tin and lead can contain alpha particles. The methods and structures presented herein mitigate such alpha particles. More specifically, embodiments herein use an interconnect scheme which can use copper as a primary interconnect member. Copper is known to have superior alpha blocking properties compared to other metals such as solders (Sn/Pb family, other Sn alloys). Additionally copper is generally not a source of alpha particles, while solders of Sn/Pb family or other Sn alloys based are.

Copper column or columnar interconnections are used in current integrated circuit technology as second level interconnections, between the ceramic module and the organic card or board. Copper columns are known to provide superior reliability as compared to conventional ball grid arrays (BGAs) because of the column's larger height, which translates to lower strain levels. For example, see U.S. Pat. Nos. 5,698,465; 6,555,296; and 7,271,483, which are incorporated herein by reference, for a full discussion of pillar interconnections. These patents explain how a chip is attached to organic packages using a copper pillar connection. However, this copper pillar is finally plated with standard solder alloys when connected to the substrate input/output (I/O) pads. Such solder alloys are alpha particle sources. Therefore, the conventional pillar interconnect structures have alpha particle problems, because the solder is inherently a source of such particles. The solder can run down or wick up the sides of the copper pillars, because of the chemical affinity between solder (e.g., Tin) and copper. This allows the alpha particles in the solder to more closely approach the chip.

Figure 2:
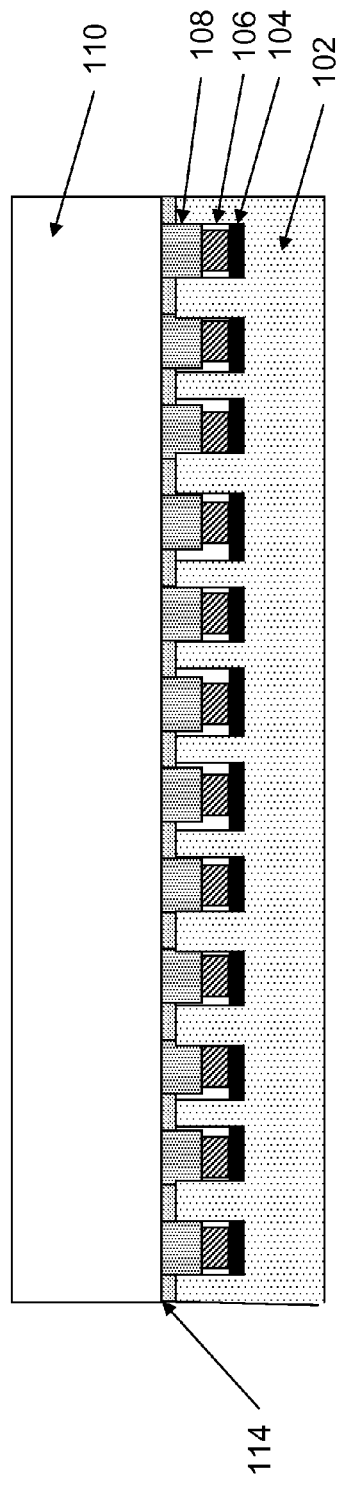
FIG. 2 is a schematic cross-sectional diagram of an integrated circuit structure according to embodiments herein.

In light of this, as shown in FIGS. 1 and 2, the present disclosure provides a structure that comprises a carrier 102 connected to an integrated circuit chip 110 by the pillars 106 and openings 112. More specifically, FIG. 1 illustrates the chip 110 separate from the carrier 102 and FIG. 2 illustrates the two connected to one another.

Thus, in this structure, at least one conductive pillar 106 extends a distance (or height) from the surface of the integrated circuit chip 110, and a barrier 108 surrounds the lower portion of each conductive pillar 106 such that the barriers 108 cover at least some of the height of each pillar 106 (e.g., where this "lower portion" is the distance from the surface of the integrated circuit chip 110 that is closest to the chip 110 surface). The barrier 108 can comprise any material that has low wettability to solder or other joining material, and is compatible with the processing for the remainder of the structure, such as CoWP, CoP, Ni (B, P, V), PSPI (photosensitive polymide), BCB (benzo-cyclo-butene), epoxy, or any other similar alpha-particle transmission resistant materials.

There is at least one opening 112 in the carrier 102 that is large enough to accommodate the conductive pillar 106 and the barrier 108, and the conductive pillar 106 and the barrier 108 are positioned in opening 112. A solder 104 is used in the bottom of the opening 112 to connect the conductive pillar 106 to the bottom of the opening 112. Again, the barrier 108 prevents the solder 104 from contacting the portion of the conductive pillar 106 protected by the barrier 108.

As mentioned above, the opening 112 can have a depth less than the distance the pillar 106 extends from the surface of the substrate such that a gap exists between the chip 110 and the carrier 102 and this gap can be filled with insulating underfill 114 material (polymide, oxide, nitride, etc.). Also, the opening 112 can be just slightly larger (e.g., 1%,-20%) than the barrier 108 and have the same general shape, which allows the barrier 108 to seal (or partially seal) the opening 112. Thus, to a certain extent, the barrier 108 can prevent the solder 104 from exiting the opening 112 during the reflowing of the solder 104. Also, the barrier 108 can have a somewhat tapered shape to help act as a sealing device.

Also, the solder 104 can comprise a lead-based solder 104 and/or a lead-free solder 104. The barrier 108 can comprise an insulator. In addition, the carrier 102 comprises corresponding conductors at the bottoms of the openings 112 such that the process of inserting the conductive pillars 106 into the openings 112 creates an electrical connection between the chip 110 and the carrier 102.

Embodiments herein also include methods for forming one or more conductive pillars 106 (comprising, for example, copper) extending a certain distance from the surface of an integrated circuit chip 110. While some methods are shown in greater detail in FIGS. 3-11, an overall method can be seen in FIGS. 1 and 2. The various processes of material deposition, patterning, etching, polishing, bonding, etc. that are involved with the following methods are well-known by those ordinarily skilled in the art as evidenced by the teachings from the U.S. Pat. Nos. 5,698,465; 6,555,296; and 7,271,483, incorporated by reference above, and a detailed discussion of the same is not included herein to focus the reader on the salient aspects of the invention.

More specifically, the overall method forms the barrier 108 surrounding the lower portion of each conductive pillar 106. Again, the "portion" of the pillar 106 that is protected by the barrier 108 comprises at least some of the total pillar 106 height (distance) from the surface of the integrated circuit chip 110. The barrier 108 covers the part (e.g., some or most) of the pillar 106 that is closest to the chip 110 surface, leaving the distal end of the pillar 106 not protected by the barrier 108. As mentioned above, the barrier 108 comprises a material that is resistant to alpha particle transmission and can be formed from any common alpha-particle transmission-resistant materials including a polymer composition, for example photosensitive polyimide (PSPI), benzo-cyclo-butene (BCB), epoxy, etc.

The method also forms the one or more openings 112 in a chip carrier 102. These openings 112 are large enough to accommodate the conductive pillar 106 and the barrier 108. Solder 104 is deposited into the opening 112 and rests at the bottom of the opening 112. The solder 104 does not completely fill the opening 112, but only fills less than the bottom approximate quarter or up to half (e.g., more than 1%, but less than 50%) of the depth of the opening 112. As shown by the arrow in FIG. 1, the conductive pillar 106 (having the barrier 108) is inserted into the opening 112 and the solder 104 is reflowed (heated to a liquid state and then cooled back to a solid state) to connect the top of the conductive pillar 106 to the bottom of the opening 112 to result in the structure shown in FIG. 2. The barrier 108 prevents the solder 104 from contacting the portion of the conductive pillar 106 protected by the barrier 108.

Regarding the size of the opening 112, the process of forming the openings 112 in the carrier 102 can form such openings 112 to a depth that is less than the distance the pillar 106 extends from the surface of the substrate (less than the overall pillar 106 height). This can create a gap between the chip 110 and the carrier 102 after the process of inserting the conductive pillar 106 into the opening 112. An underfill 114 can optionally fill in this gap. Further, this process can form the openings 112 such that the size and shape of the diameter of the openings 112 match the size and shape of the diameter of the barrier 108. In other words, the opening 112 can be just slightly larger (e.g., 1%,-20%) than the barrier 108 and has the same general shape, which allows the barrier 108 to seal (or partially seal) the opening 112. Thus, to a certain extent, the barrier 108 can prevent the solder 104 from exiting the opening 112 during the reflowing of the solder 104.

Figure 3:
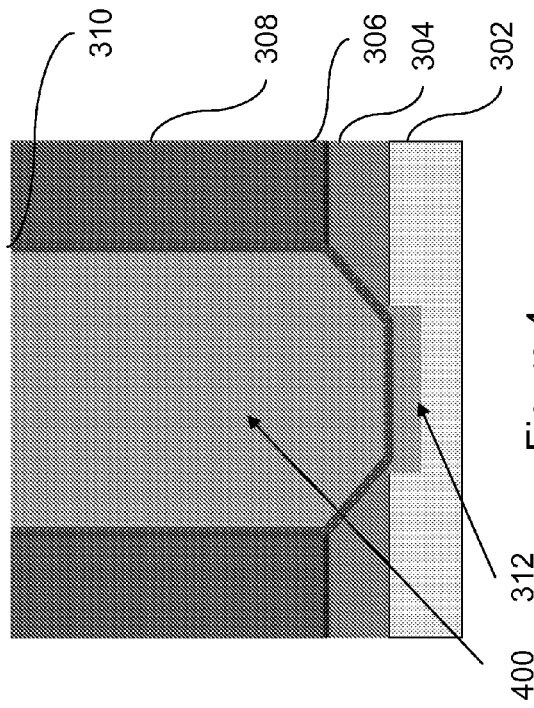
FIG. 3 is a schematic cross-sectional diagram of an integrated circuit structure according to embodiments herein.
Figure 4:
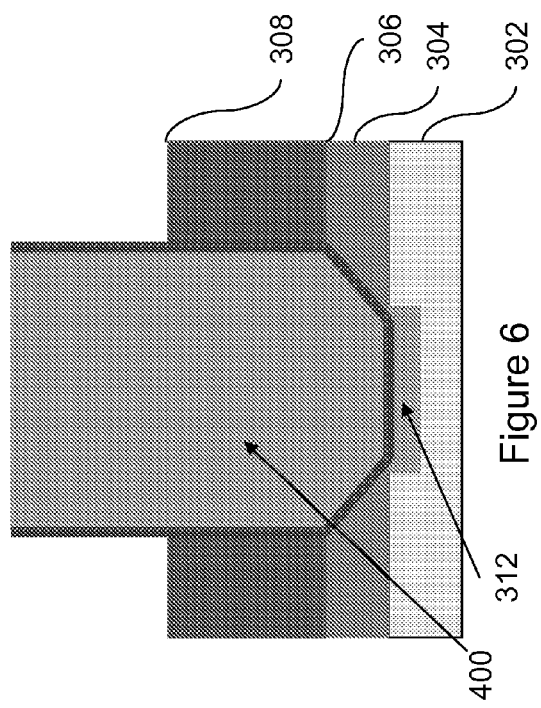
FIG. 4 is a schematic cross-sectional diagram of an integrated circuit structure according to embodiments herein.
Figure 5:
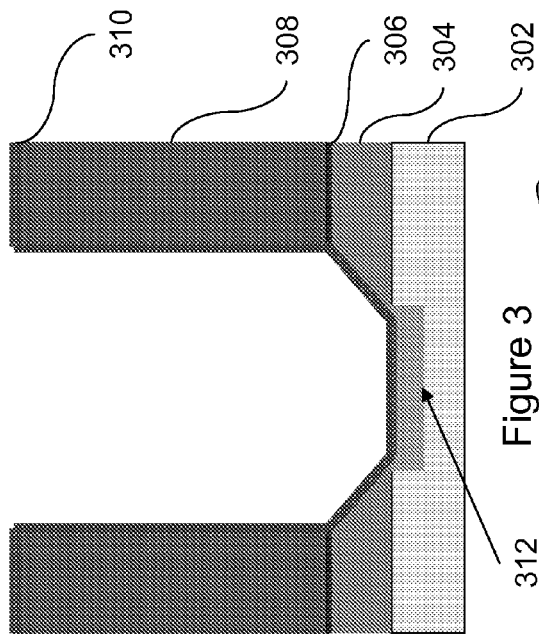
FIG. 5 is a schematic cross-sectional diagram of an integrated circuit structure according to embodiments herein.
Figure 6:
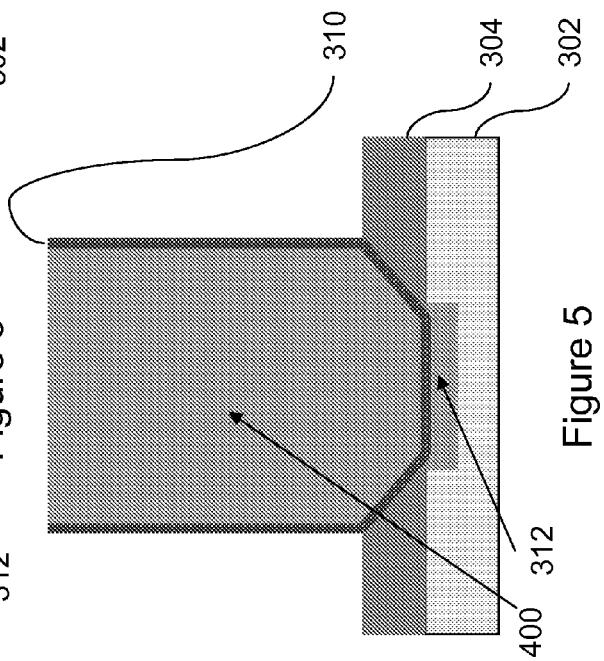
FIG. 6 is a schematic cross-sectional diagram of an integrated circuit structure according to embodiments herein.

Regarding some specific methodologies utilized to form the conductive pillars and barriers, FIGS. 3-5 illustrate one process for doing so. In FIG. 3, item 312 illustrates a contact that extends through an outer insulator layer 304 on the outer surface of the integrated circuit chip 302. A barrier etch stop layer 306 (TaN, TiW, TiN, etc.) can be sputtered on the insulator layer 304 before a photosensitive sacrificial material 308 is patterned thereon. Item 310 represents a liner or seed material (TaN, Ta, Cu, etc.) that has been sputtered to line the opening.

FIG. 4 illustrates the structure after a metal material 400 has been plated into the opening and the opening has been polished. The polishing process can also remove the overlying liner 310 from the tops of the sacrificial photoresist 308. FIG. 5 illustrates the structure after the sacrificial material 308 has been removed (using, for example, an N2/H2 reactive ion etching, or a wet etching process) and after the etch stop layer 306 has been sputtered or etched away. Thus, FIG. 5 illustrates the conductive pillar 400, without a protective barrier. The structure shown in FIG. 6 can be formed by only partially removing the sacrificial material 308. In one embodiment for the structure shown in FIG. 6, a specific material, such as photosensitive polyimide (PSPI) can be used as the sacrificial material 308.

Figure 8:
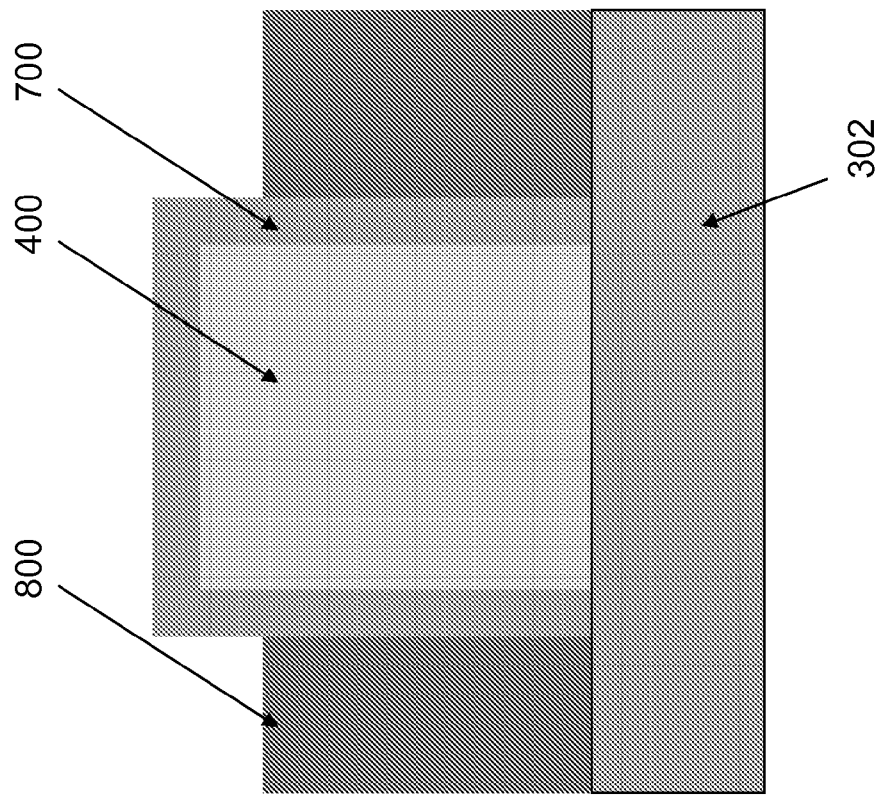
FIG. 8 is a schematic cross-sectional diagram of an integrated circuit structure according to embodiments herein.
Figure 7:
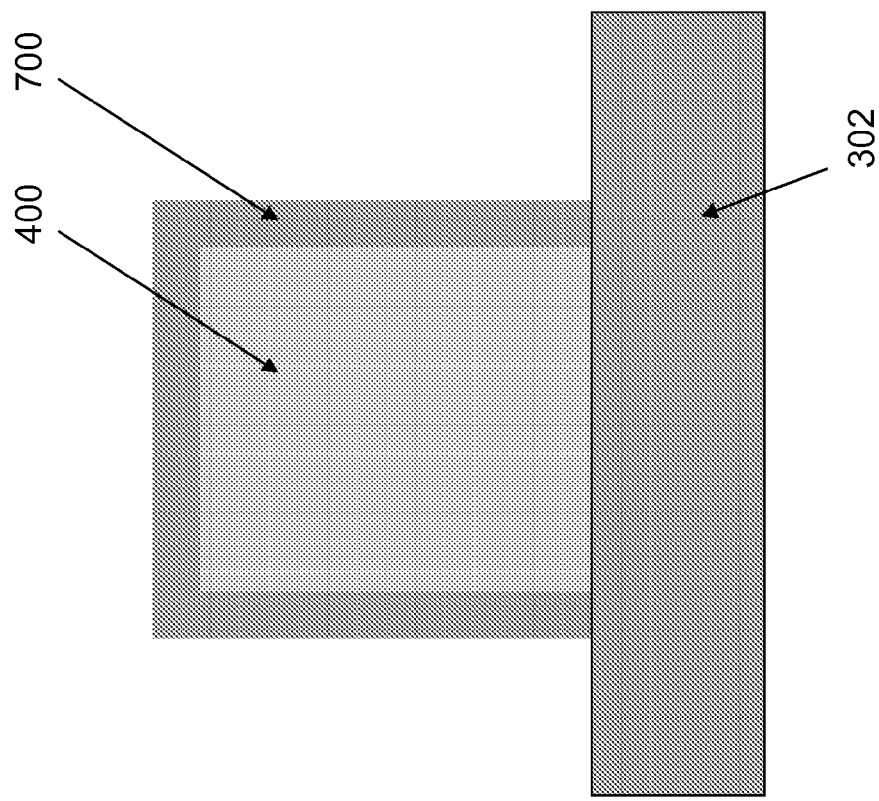
FIG. 7 is a schematic cross-sectional diagram of an integrated circuit structure according to embodiments herein.
Figure 10:
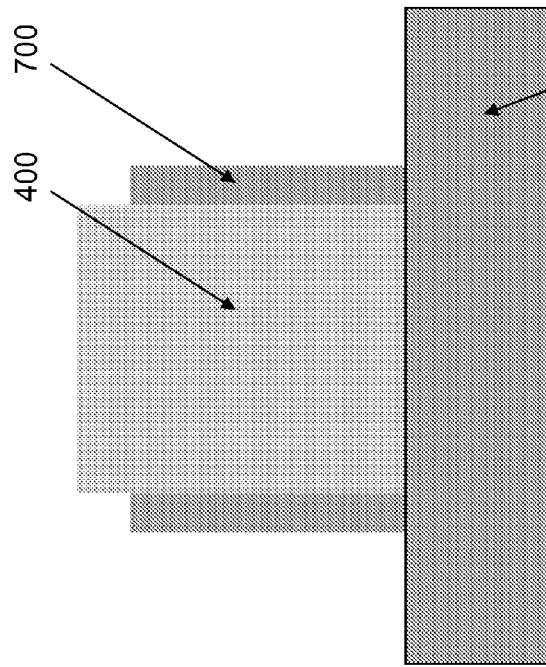
FIG. 10 is a schematic cross-sectional diagram of an integrated circuit structure according to embodiments herein.
Figure 11:
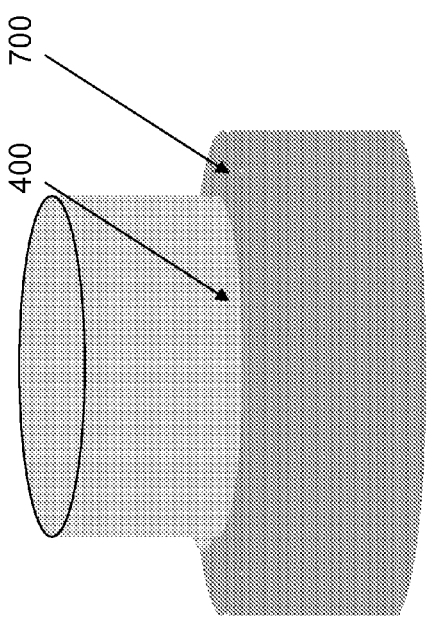
FIG. 11 is a schematic perspective view diagram of an integrated circuit structure according to embodiments herein.
Figure 9:
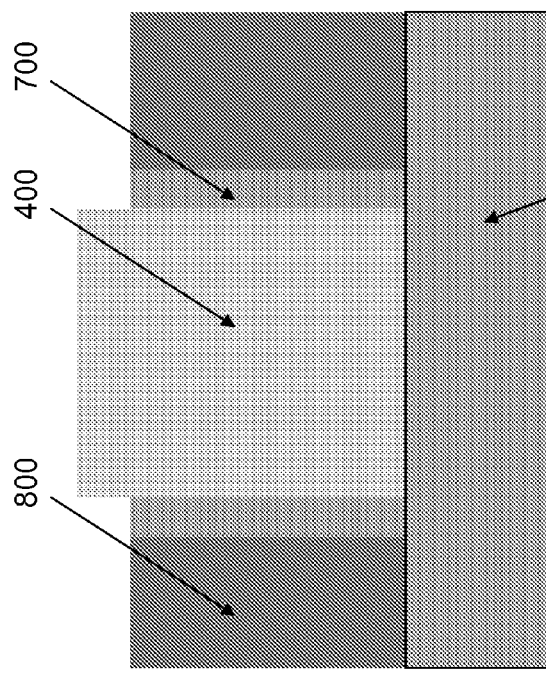
FIG. 9 is a schematic cross-sectional diagram of an integrated circuit structure according to embodiments herein.

FIGS. 7-11 illustrate another process that can be used to form the conductive pillars and barriers. More specifically, FIG. 7 illustrates (in more simplified form) the metallic stud 400 formed extending from the chip 302 described in FIG. 5, above. In FIG. 7, electro-less plating is performed to form the barrier materials 700, which can comprise, for example, CoWP, CoP, Ni (B, P, V), etc., on the metallic pillar 400. FIG. 8 illustrates the formation of a sacrificial polymer 800 and FIG. 9 illustrates the removal of the upper portion of the barrier layer 700 that is not protected by the sacrificial polymer 800. Next, as illustrated in FIG. 10, the sacrificial polymer 800 can be removed, leaving the conductive pillar 400 and the barrier material 700. The same structure is illustrated in perspective view in FIG. 11.

While various methods have been described, above, one ordinarily skilled in the art would understand that the invention is not limited to these methods, and that these methods are merely examples of how the invention could be implemented. Therefore, the invention could be used in the foregoing methods, as well as all similar methods and the following claims are intended to encompass all similar methods.

Thus, as shown above, the present invention provides an improved copper interconnection structure, which may be a single column or multiple column interconnections between two opposing I/O pads (one on the chip 110, the other on the packaging substrate). Multiple interconnects are able to flex and provide plastic deformation. This plastic deformation is a means of dissipating thermal expansion mismatch stress. The stress felt at the chip via is therefore reduced. Plastic deformation in multiple slender columns in known to be an advantage in enhancing thermo mechanical fatigue (TMF) reliability.

Further, with the foregoing structures, the interconnection is embedded in the Solder Resist Opening (SRO) on the organic package side. Similarly, for ceramic packages, an embedded via in the ceramic surface will allow for the interconnection to be embedded.

The final connection may be achieved using a small amount of joining solder. However, the solder is placed in a way so as to inhibit the movement of the solder up the column side walls. This embedding of the solder prevents alpha particles from traveling into the chip area. The underfill encapsulation of the structure further blocks any stray alpha particle emissions from the solder or package.

While the invention has been described in terms of preferred embodiments, those skilled in the art will recognize that the invention can be practiced with modification within the spirit and scope of the appended claims.

What is claimed is:
1. A structure comprising:
   an integrated circuit chip;
   a carrier connected to said integrated circuit chip;
   at least one conductive pillar extending from a surface of said integrated circuit chip;
   a barrier circumferentially surrounding at least a portion of said at least one conductive pillar;
   at least one opening in said carrier wherein said at least one conductive pillar and said barrier are positioned in said at least one opening; and
   solder in a bottom of said at least one opening connecting said at least one conductive pillar to said bottom of said opening,
   wherein a size and a shape of said at least one opening is substantially equal to a size and a shape of said barrier, such that said barrier prevents said solder from exiting said at least one opening.

2. The structure according to claim 1, wherein said at least one opening comprises a depth less than said distance said at least one conductive pillar extends from said surface of said substrate such that a gap exists between said chip and said carrier.

3. The structure according to claim 2, further comprising an underfill in said gap.

4. The structure according to claim 1, wherein said solder comprises a lead-based solder.

5. A structure comprising:
   an integrated circuit chip;
   a carrier connected to said integrated circuit chip;
   at least one conductive pillar comprising copper extending from a surface of said integrated circuit chip;

a barrier circumferentially surrounding at least a portion of said at least one conductive pillar, wherein said barrier comprises an alpha-particle transmission-resistant material;
at least one opening in said carrier, wherein said at least one conductive pillar and said barrier are positioned in said at least one opening; and
a solder in a bottom of said opening connecting said at least one conductive pillar to said bottom of said at least one opening,
wherein a size and shape of said at lest one opening is substantially equal to a size and a shape of said barrier, such that said barrier prevents said solder from exiting said at least one opening.

6. The structure according to claim 5, wherein said at least one opening comprises a depth less than said distance said at least one conductive pillar extends from said surface of said substrate such that a gap exists between said chip and said carrier.

7. The structure according to claim 6, further comprising an underfill in said gap.

8. The structure according to claim 5, wherein said solder comprises a lead-based solder.

* * * * *